United States Patent
Tsai et al.

(10) Patent No.: US 9,754,906 B2
(45) Date of Patent: Sep. 5, 2017

(54) DOUBLE PLATED CONDUCTIVE PILLAR PACKAGE SUBSTRATE

(71) Applicant: Advanced Semiconductor Engineering, Inc., Kaohsiung (TW)

(72) Inventors: Li-Chuan Tsai, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/750,880

(22) Filed: Jun. 25, 2015

(65) Prior Publication Data
US 2016/0379950 A1 Dec. 29, 2016

(51) Int. Cl.
*H01L 23/00* (2006.01)

(52) U.S. Cl.
CPC .............. *H01L 24/11* (2013.01); *H01L 24/13* (2013.01); *H01L 2224/11464* (2013.01); *H01L 2224/13026* (2013.01); *H01L 2224/13082* (2013.01)

(58) Field of Classification Search
CPC . H01L 2924/01079; H01L 2224/13099; H01L 2924/01029; H01L 2924/01078; H01L 2924/01013; H01L 21/4857; H01L 24/11; H01L 24/13

USPC .......................................... 257/737; 438/614
See application file for complete search history.

(56) References Cited

U.S. PATENT DOCUMENTS

| | | | |
|---|---|---|---|
| 2006/0292851 A1* | 12/2006 | Lin .................. | H01L 24/13 438/618 |
| 2011/0193220 A1* | 8/2011 | Kuo .................. | H01L 24/11 257/737 |
| 2013/0181340 A1 | 7/2013 | Uehling et al. | |
| 2013/0341786 A1 | 12/2013 | Hsu et al. | |
| 2015/0061115 A1* | 3/2015 | Chen .................. | H01L 24/13 257/737 |
| 2015/0171039 A1* | 6/2015 | Cheng .................. | H01L 23/488 257/737 |
| 2015/0250054 A1* | 9/2015 | Yoshikawa .......... | H05K 3/4007 361/767 |

\* cited by examiner

*Primary Examiner* — Walter H Swanson
(74) *Attorney, Agent, or Firm* — Foley & Lardner LLP; Cliff Z. Liu (57) ABSTRACT

The present disclosure relates to a package substrate. The package substrate includes a patterned conductive layer and conductive pillars. Each of the conductive pillars includes a first portion and a second portion, where the first portion contacts the patterned conductive layer at one end of the first portion, and the second portion is adjacent to another end of the first portion. A thickness of the first portion is greater than a thickness of the second portion. Side surfaces of the first portion are substantially coplanar to side surfaces of the second portion.

20 Claims, 13 Drawing Sheets

DOUBLE PLATED CONDUCTIVE PILLAR PACKAGE SUBSTRATE

BACKGROUND

1. Technical Field

The present disclosure relates, in general, to a conductive pillar substrate for semiconductor device packages and a method for making the same. More specifically, the present disclosure relates to a double plated conductive pillar substrate and a double plating manufacturing method for making the double plated conductive pillar substrate.

2. Description of the Related Art

There is continued demand for decreased size, reduced weight, improved performance, improved reliability and lower costs for electronic products, such as cell phones and wearable electronics. Accordingly, improvements such as system-on-chip (SoC) packages have been developed. SoC packages integrate multiple functionalities at the chip level; however, designing and testing SoC packages can be difficult, and SoC manufacturing can be relatively costly and low-yield. Therefore, package on package (PoP) technology is becoming increasingly popular since it allows denser integration of circuits in a small package. There is a continuing drive to develop PoP packaging techniques.

SUMMARY

According to an embodiment of the present disclosure, a package substrate is provided. The package substrate includes a patterned conductive layer and conductive pillars. Each of the conductive pillars includes a first portion and a second portion, where one end of the first portion contacts the patterned conductive layer, and the second portion is adjacent to another end of the first portion. A thickness of the first portion is greater than a thickness of the second portion. Side surfaces of the first portion are substantially coplanar to side surfaces of the second portion.

According to another embodiment of the present disclosure, a semiconductor packaging structure is provided. The semiconductor packaging structure includes a first substrate, a semiconductor device and a second substrate. The first substrate includes first pads and second pads. The semiconductor device is positioned on the first substrate and is electrically connected to the first pads. The second substrate includes a patterned conductive layer and conductive pillars. Each of the conductive pillars includes a first portion and a second portion. One end of the first portion contacts the patterned conductive layer, and the second portion is adjacent to another end of the first portion. A thickness of the first portion is greater than a thickness of the second portion. Side surfaces of the first portion are substantially coplanar to side surfaces of the second portion. The conductive pillars surround the semiconductor device and are connected to the second pads.

According to another embodiment of the present disclosure, a method for manufacturing a package substrate is provided. A package substrate is provided. The package substrate includes a patterned conductive layer and conductive pillars. A first portion of each of the conductive pillars is formed on the patterned conductive layer. A second portion of each of the conductive pillars is formed on a corresponding first portion. A thickness of the first portion is greater than a thickness of the second portion. Side surfaces of the first portion are substantially coplanar to side surfaces of the second portion.

BRIEF DESCRIPTION OF THE DRAWINGS

Common reference numerals are used throughout the drawings and the detailed description to indicate the same or similar elements. The present disclosure will be more apparent if the following detailed description is taken in conjunction with the accompanying drawings.

DETAILED DESCRIPTION

In PoP technology, conductive pillars may be used to form electrical interconnections between a top package and a bottom package. A uniformity of the conductive pillars is related to an expected height and an aspect ratio of the conductive pillars. In embodiments in which the conductive pillars extend higher than the height of a die, it can be difficult to control uniformity in height of the conductive pillars.

Described in the present disclosure is a package substrate with improved uniformity in height for conductive pillars. The conductive pillars can be made of a conductive material. One such conductive material is a metal, such as copper.

The following definitions apply to some of the aspects described with respect to some embodiments of the present disclosure. These definitions may likewise be expanded upon herein.

The height of a conductive pillar or a portion of a conductive pillar is referred to as a "thickness" herein, referencing an amount that the pillar or portion of the pillar extends vertically in the orientation illustrated in the figures.

As used herein, the singular terms "a," "an," and "the" include plural referents unless the context clearly dictates otherwise.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

As used herein, the terms "connect," "connected," and "connection" refer to an operational coupling or linking.

Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

It can be difficult to control a uniformity of thickness of conductive pillars when the thickness of the pillars is greater than or equal to about 50 µm and the pillars are formed by a single plating process. That is, the thicker the desired pillars, the more deviation that can be expected. The pillars may be formed by a plating process, and then ground or polished so as to maintain uniformity of thickness; however, grinding conductive pillars can cause dimensional deviation for package substrates, which may be more pronounced in thin packages.

According to an embodiment of the present disclosure, a technique for forming uniform conductive pillars with a relatively large thickness (e.g., greater than or equal to about 50 µm) is to form the pillars by double or multiple plating. That is, a portion of each of the conductive pillars is formed by a first plating, and then the rest of each of the conductive pillars is formed by a second plating.

Figure 1:
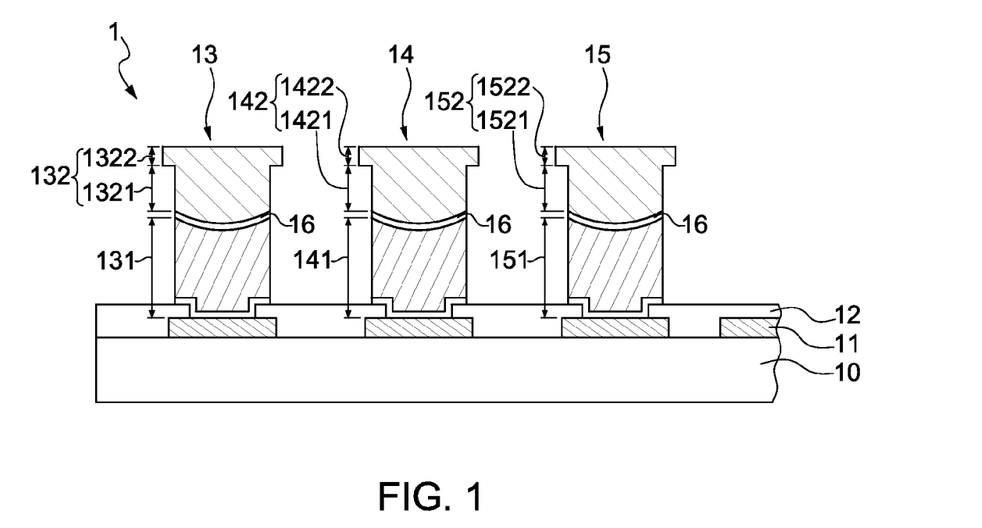
FIG. 1 illustrates a cross-sectional view of a package substrate in accordance with an embodiment of the present disclosure.

FIG. 1 illustrates a package substrate in accordance with an embodiment of the present disclosure, with a double plated conductive pillar. The package substrate 1 includes a patterned conductive layer 11, a core layer 10, an insulating layer 12 and conductive pillars 13, 14 and 15. Each of the conductive pillars 13, 14, 15 includes a respective first portion 131, 141, 151 and a respective second portion 132, 142, 152. One end of each of the first portions 131, 141, 151 contact the patterned conductive layer 11, and the other end of the first portions 131, 141, 151 contact corresponding ones of the second portions 132, 142, 152. A thickness of the first portions 131, 141, 151 is greater than a thickness of the second portions 132, 142, 152. Side surfaces of the first portions 131, 141, 151 are substantially coplanar to side surfaces of the corresponding second portions 132, 142, 152. A thickness of each of the conductive pillars 13, 14, 15 is greater than or equal to about 50 µm, and a thickness of the first portions 131, 141, 151 is about 60 percent to about 75 percent of the thickness of the respective conductive pillars 13, 14, 15.

As shown in FIG. 1, a seed layer 16 is formed between the first portions 131, 141, 151 and the corresponding second portions 132, 142, 152. In the embodiment of FIG. 1, adjacent to the seed layer 16, the first portions 131, 141, 151 have concave surfaces, and the second portions 132, 142, 152 have convex surfaces. The second portions 132, 142, 152 each include a respective first sub-portion 1321, 1421, 1521 and a respective second sub-portion 1322, 1422, 1522, and there are corners between the first sub-portion 1321, 1421, 1521 and the corresponding second sub-portion 1322, 1422, 1522. A thickness of the second sub-portions 1322, 1422, 1522 is about 20 µm to about 40 µm. A width of each of the second sub-portions 1322, 1422, 1522 in FIG. 1 is greater than a width of the respective first sub-portions 1321, 1421, 1521 in FIG. 1. Therefore, the conductive pillars in FIG. 1 are formed in a T-shape. Thus, for example, when the conductive pillars are in contact with a pre-solder on another substrate, the T-shaped conductive pillars may provide a better interlock with the pre-solder at the junction due to their T-shape (as shown in FIG. 4B).

Figure 2:
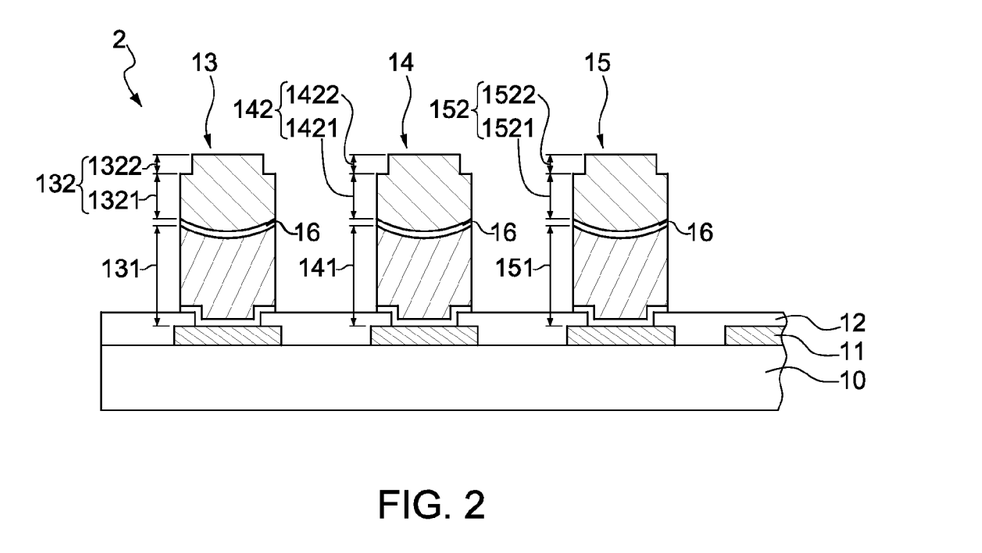
FIG. 2 illustrates a cross-sectional view of a package substrate in accordance with another embodiment of the present disclosure.

FIG. 2 illustrates a cross-sectional view of a package substrate 2 in accordance with another embodiment of the present disclosure. The package substrate 2 is similar to the package substrate 1 shown in FIG. 1, except that in FIG. 2, the width of each of the second sub-portions 1322, 1422, 1522 is less than the width of the respective first sub-portions 1321, 1421, 1521. Therefore, the conductive pillars in FIG. 2 are formed in an inverted T-shape. When the conductive pillars are in contact with the pre-solder on another substrate, the inverted T-shaped conductive pillars may provide extra space in the notch defined by a top surface of the first sub-portions 1321, 1421, 1521 and side surfaces of the respective second sub-portions 1322, 1422, 1522. Such notches may provide sufficient extra space for the pre-solder, so that the pre-solder can be kept within the extra space (as shown in FIG. 5B) and is less likely to overflow to nearby pillars and cause a short-circuit between pillars.

Figure 3:
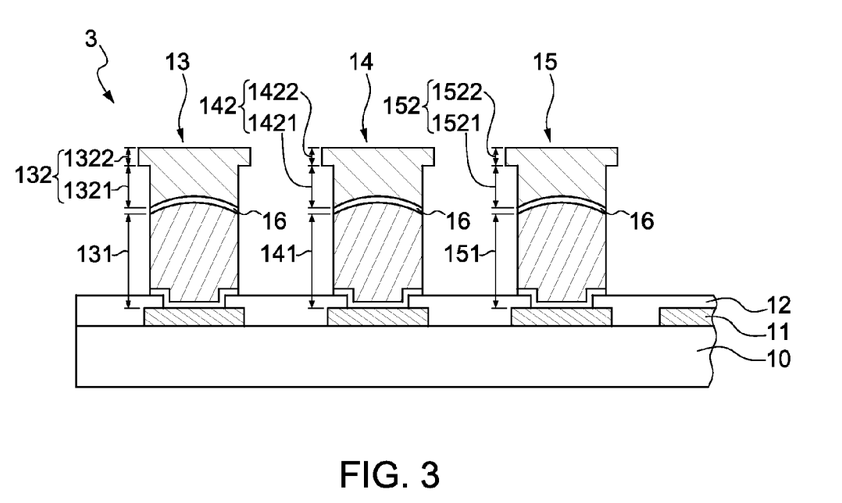
FIG. 3 illustrates a cross-sectional view of a package substrate in accordance with another embodiment of the present disclosure.

FIG. 3 illustrates a cross-sectional view of a package substrate 3 in accordance with another embodiment of the present disclosure. The package substrate 3 is similar to the package substrate 1 shown in FIG. 1, except that, adjacent to the seed layer 16, the first portions 131, 141, 151 have convex surfaces, and the second portions 132, 142, 152 have concave surfaces, as illustrated in FIG. 3.

Figure 4A:
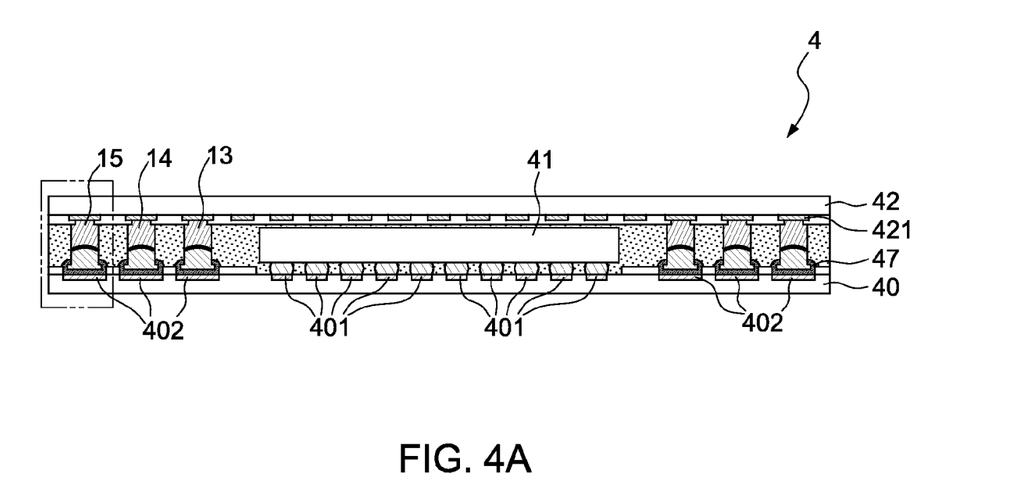
FIG. 4A illustrates a semiconductor packaging structure with a package substrate in accordance with an embodiment of the present disclosure.
Figure 4B:
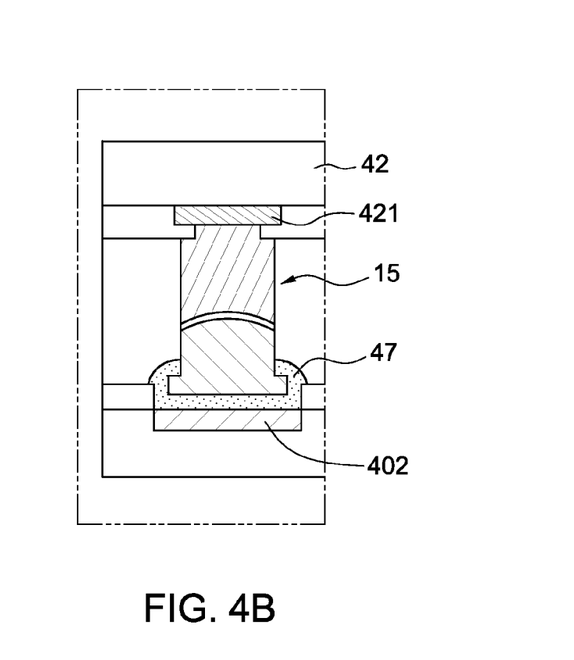
FIG. 4B illustrates a portion of the semiconductor packaging structure in FIG. 4A.

FIG. 4A illustrates a semiconductor packaging structure 4 with a package substrate according to embodiments of the present disclosure. The semiconductor packaging structure 4 includes a first substrate 40, a semiconductor device 41 and a second substrate 42. The first substrate 40 includes first pads 401 and second pads 402. The semiconductor device 41 is located on the first substrate 40 and is electrically connected to the first pads 401. The second substrate 42 includes a patterned conductive layer 421. The second substrate 42 further includes conductive pillars 13, 14, 15 on the patterned conductive layer 421. The conductive pillars 13, 14, 15 are positioned around a periphery of the semiconductor device 41 and are connected to the second pads 402.

FIG. 4B is a drawing of an enlargement of the area surrounded by dotted line in FIG. 4A. As shown in FIG. 4B, when the conductive pillar 15 is in contact with a pre-solder 47 on the first substrate 40, the conductive pillar 15 can provide an interlock with the pre-solder 47 due to the T shape of the conductive pillar 15.

Figure 5A:
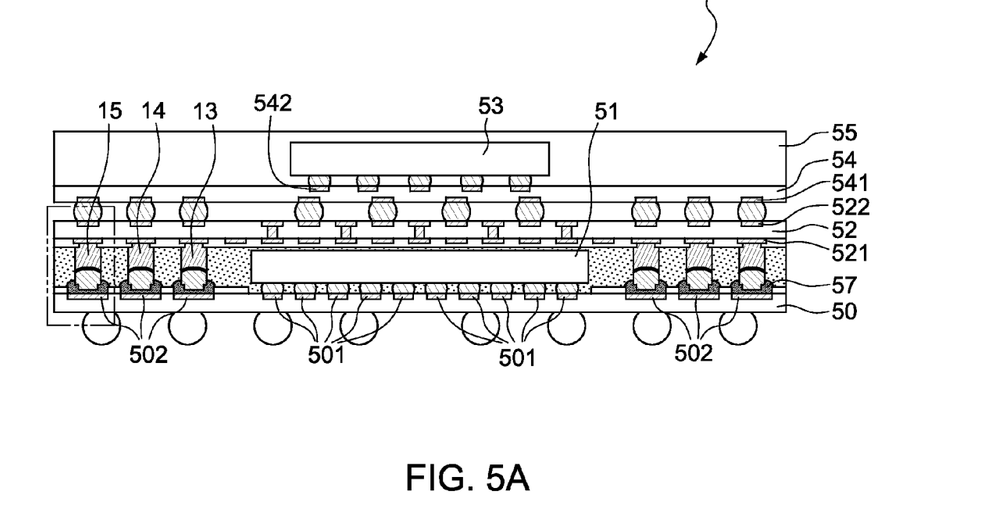
FIG. 5A illustrates another semiconductor packaging structure with a package substrate according to an embodiment of the present disclosure.
Figure 5B:
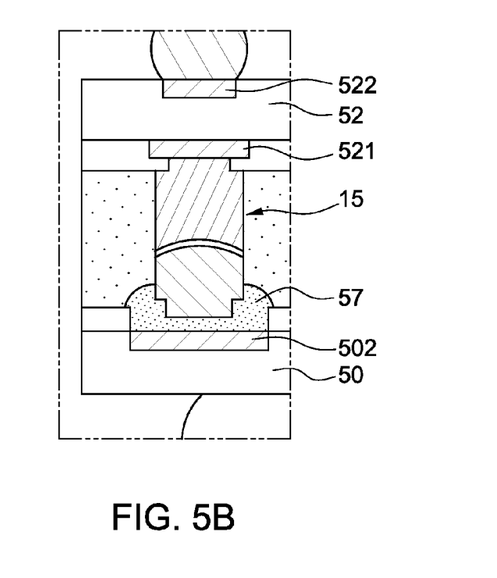
FIG. 5B illustrates a portion of the semiconductor packaging structure in FIG. 5A.

FIG. 5A illustrates a semiconductor packaging structure 5 with a package substrate according to embodiments of the present disclosure. The semiconductor packaging structure 5 includes a first substrate 50, a first semiconductor device 51, a second substrate 52, a second semiconductor device 53 and a third substrate 54. The first substrate 50 includes first pads 501 and second pads 502. The semiconductor device 51 is located on the first substrate 50 and is electrically connected to the first pads 501. The second substrate 52 includes a first patterned conductive layer 521 and a second patterned conductive layer 522. The second substrate 52 further includes conductive pillars 13, 14, 15 on the first patterned conductive layer 521. The conductive pillars 13, 14, 15 are arranged around a periphery of the semiconductor device 51 and are connected to the second pads 502. In an embodiment of the present disclosure, the pillars 13, 14, 15 are arranged to surround the device 51. The third substrate 54 has a first patterned conductive layer 541 and a second patterned conductive layer 542. The first patterned conductive layer 541 of the third substrate 54 is electrically connected to the first patterned conductive layer 521 of the second substrate 52. The semiconductor device 53 is located on the third substrate 54 and is electrically connected to the second patterned conductive layer 542 of the third substrate 54. An encapsulating material 55 is used to encapsulate the semiconductor device 53.

FIG. 5B is a drawing of an enlargement of the area surrounded by dotted line in FIG. 5A. As shown in FIG. 5B, when the conductive pillar 15 is in contact with a pre-solder 57 on the first substrate 50, the conductive pillar 15 provides extra space; thus, the pre-solder 57 is less likely to overflow and cause a short-circuit between pillars (e.g., pillars 13, 14, 15).

FIGS. 6-10, FIGS. 11A-11C, FIGS. 12A-12D, FIGS. 13A-13D and FIGS. 14A-14B illustrate methods for manufacturing a package substrate in accordance with embodiments of the present disclosure.

Figure 6:
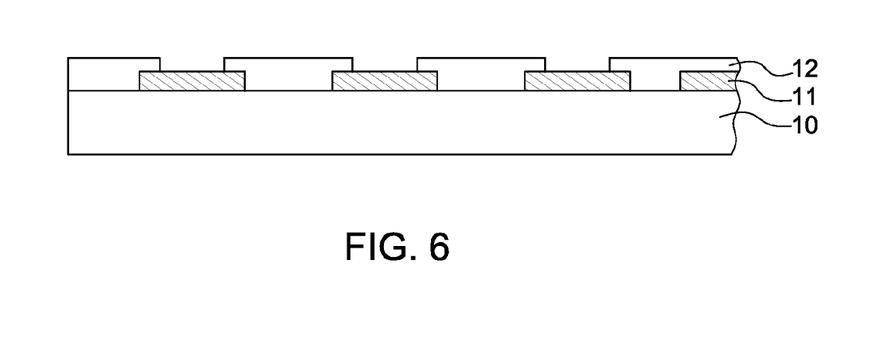
FIG. 6, FIG. 7, FIG. 8, FIG. 9, FIG. 10, FIG. 11A, FIG. 11B, FIG. 11C, FIG. 12A, FIG. 12B, FIG. 12C, FIG. 12D, FIG. 13A, FIG. 13B, FIG. 13C, FIG. 13D, FIG. 14A and FIG. 14B in various combinations illustrate methods for manufacturing package substrates in accordance with embodiments of the present disclosure.

Referring to FIG. 6, a patterned conductive layer 11 is formed on a core layer 10. The core layer 10 can be a coreless substrate or a substrate with a plated through hole. An insulating layer 12 is formed to cover the patterned conductive layer 11 and the core layer 10. Openings are formed in the insulating layer 12 to expose a portion of the patterned conductive layer 11.

Figure 7:
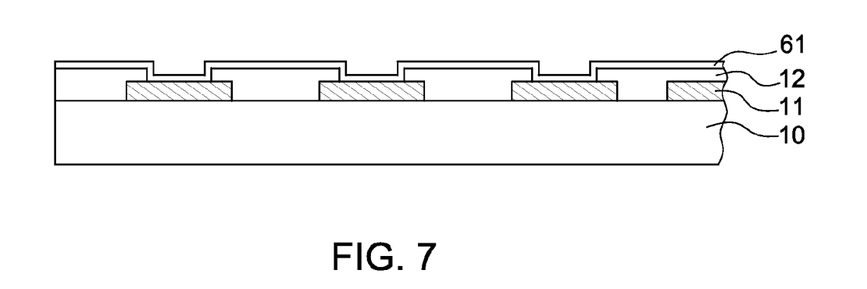

Referring to FIG. 7, a seed layer 61 is formed on the insulating layer 12 and the patterned conductive layer 11.

Figure 8:
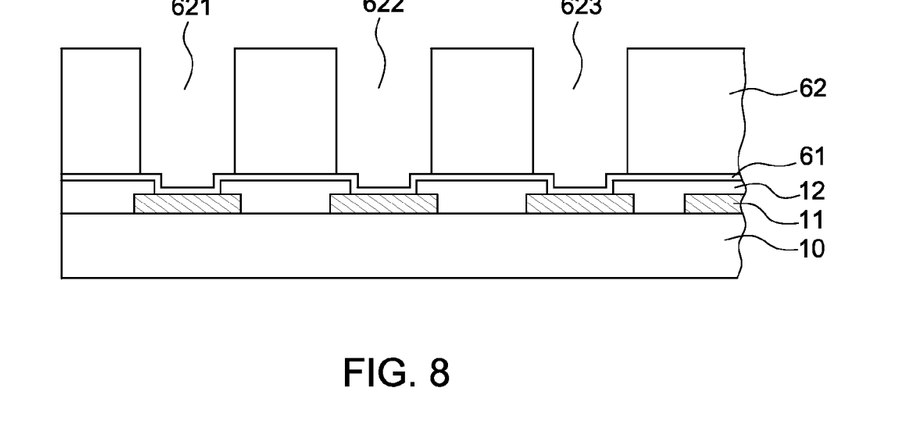

Referring to FIG. 8, a dry film layer 62 is formed on the seed layer 61. The dry film layer 62 is patterned so that the seed layer 61 is exposed in openings 621, 622 and 623 in the dry film layer 62. In an embodiment of the present disclosure, a thickness of the dry film layer 62 is about 120 μm.

Figure 9:
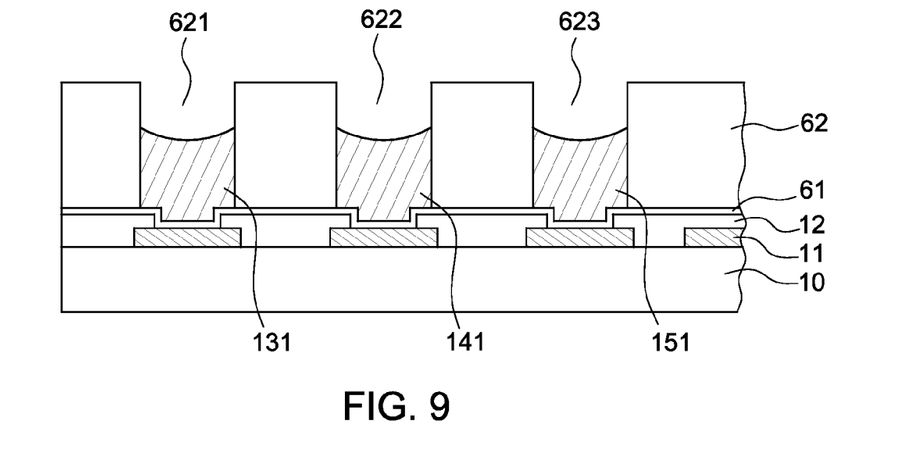

Referring to FIG. 9, a first plating solution is used to perform a first plating in the openings 621, 622, 623 to form respective first portions 131, 141, 151 (e.g., of the respective conductive pillars 13, 14, 15). A top surface of each of the first portions 131, 141, 151 can be concave or convex, depending on the type of plating solution used. In one or more embodiments, the plating solution can be CPOS provided by JCU Corporation. A characteristic of the CPOS solution is improved via filling, a desirable characteristic for plating within the openings 621, 622, 623 in the dry film layer 62. The openings 621, 622 and 623 are partially plated to form the respective first portions 131, 141, 151, whereas the remaining portions of the conductive pillars are subsequently formed using a different technique or a different material so as to achieve uniformity of thickness for the conductive pillars.

Figure 10:
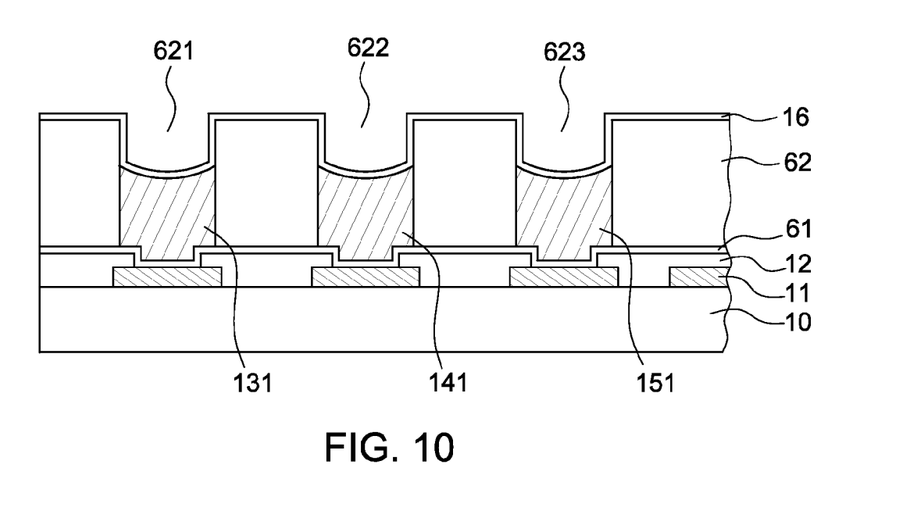

Referring to FIG. 10, a seed layer 16 is formed on the dry film layer 62 and on the first portions 131, 141, 151 of the conductive pillars in the respective openings 621, 622 and 623.

In accordance with different embodiments of the present disclosure, a package substrate can be formed subsequent to FIG. 10 by different combinations of the processes shown in FIGS. 11A-11C, FIGS. 12A-12D, FIGS. 13A-13D and FIGS. 14A-14B. Some examples follow.

Embodiment I

In accordance with an embodiment of the present disclosure, a package substrate is formed as illustrated in FIG. 11A, FIG. 12A, FIG. 13A and FIG. 14A.

Figure 11A:
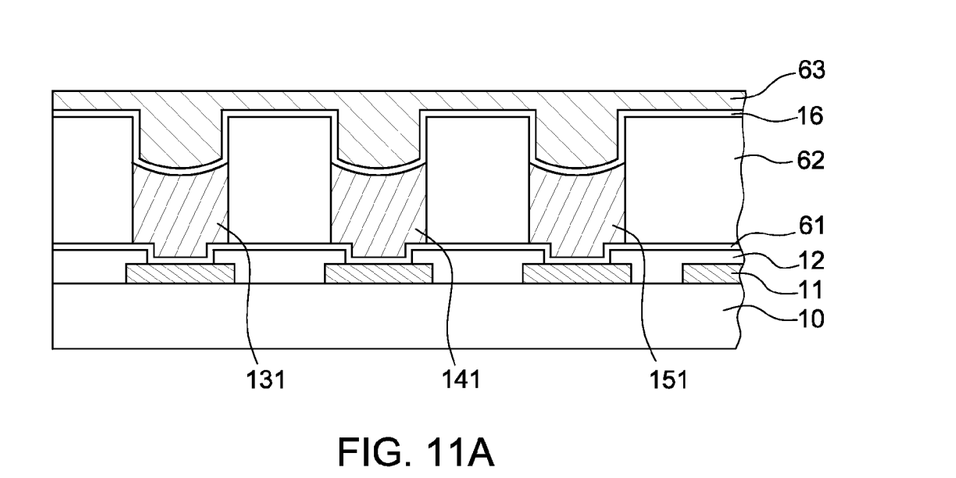

Referring to FIG. 11A, a second plating solution is used to perform a second plating to form a conductive layer 63 on the seed layer 16. In one or more embodiments, the second plating solution can be VF4 provided by JCU Corporation. A characteristic of the VF4 plating solution is better uniformity for plating a flat surface, a desirable characteristic for improved control of the planarity of the conductive layer 63.

Figure 12A:
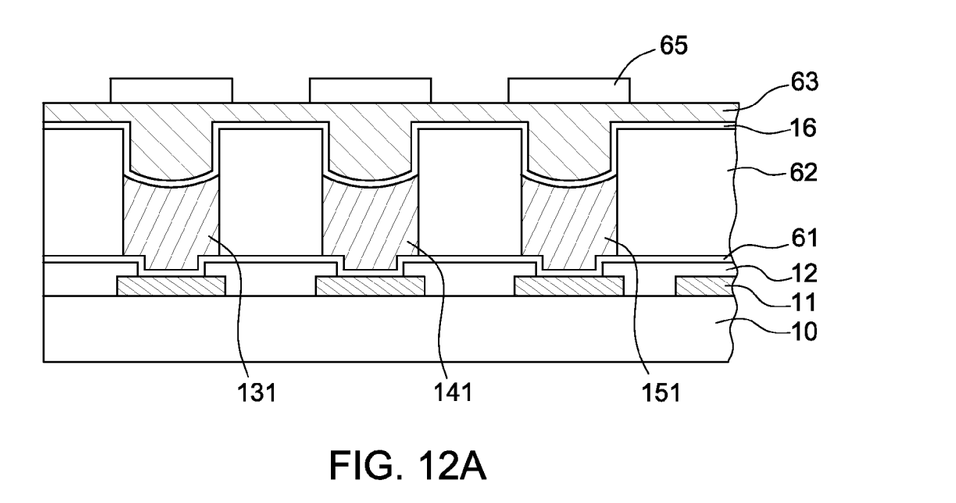

Referring to FIG. 12A, a patterned mask 65 is formed on the conductive layer 63. As illustrated, a width of each portion of the patterned mask 65 positioned above a respective first portion 131, 141, 151 is greater than a width of the respective first portion 131, 141, 151.

Figure 13A:
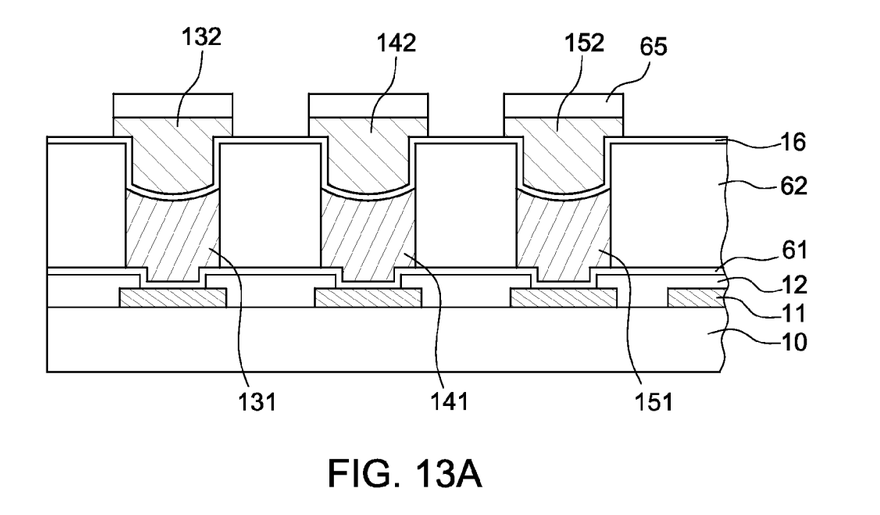
Figure 13B:
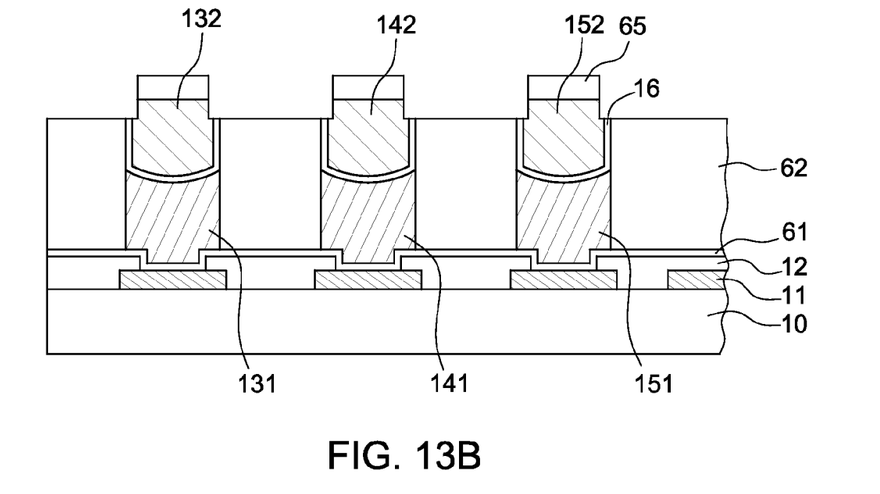

Referring to FIG. 13A, the conductive layer 63 is etched to form second portions 132, 142, 152 of the conductive pillars. Because the width of each portion of the patterned mask 65 positioned above the respective first portion 131, 141, 151 is greater than the width of the respective first portion 131, 141, 151, a width of top sections of the second portions 132, 142, 152 (e.g., the respective second sub-portions 1322, 1422, 1522 of FIG. 1) is greater than the width of the respective first portions 131, 141, 151. Together, the first portions 131, 141, 151 and the second portions 132, 142, 152 form conductive pillars with a T-shape.

Figure 14A:
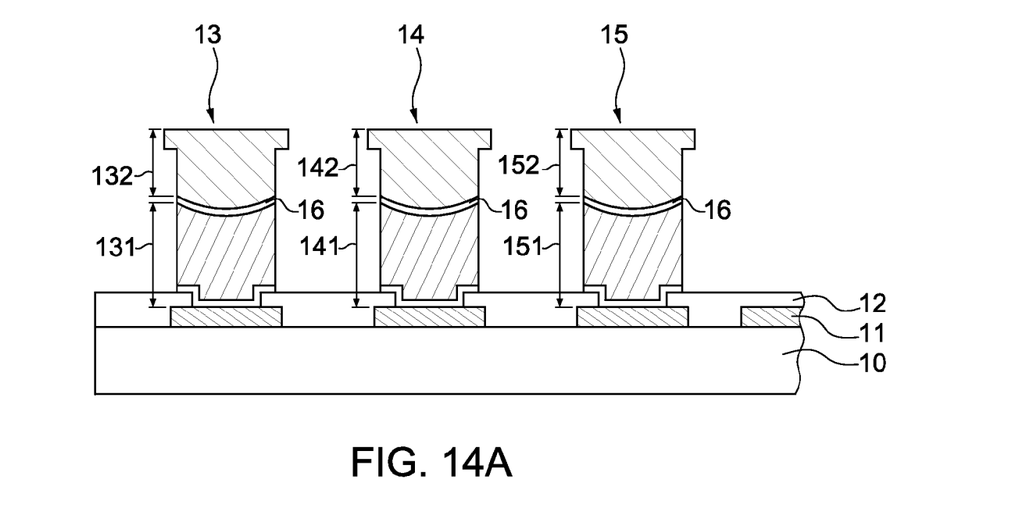

Referring to FIG. 14A, the dry film layer 62 and the patterned mask 65 are removed, such as by stripping, and the seed layer 61 is etched. The package substrate 1 in FIG. 1 is thereby formed.

Embodiment II

In accordance with an embodiment of the present disclosure, a package substrate is formed as illustrated in FIG. 11A, FIG. 12B, FIG. 13B and FIG. 14B.

Figure 12B:
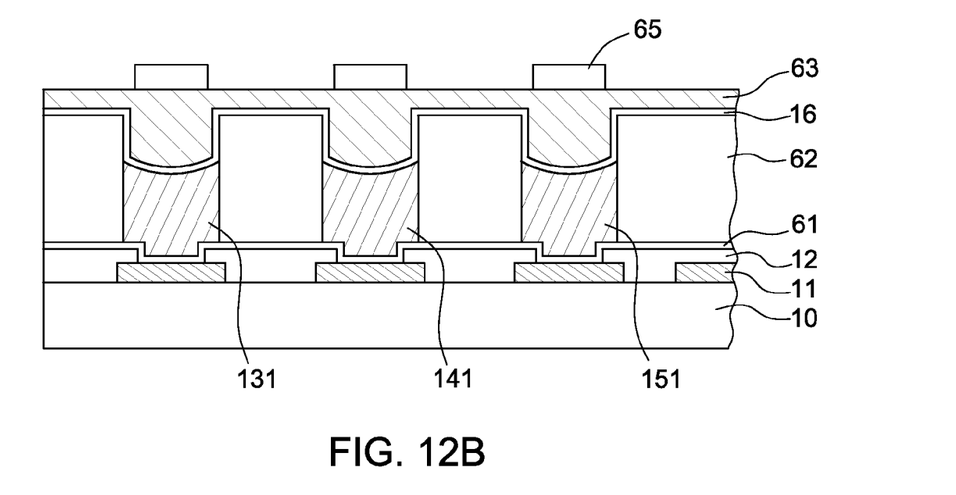

Embodiment II is similar to Embodiment I, except that, referring to FIG. 12B (instead of FIG. 12A of Embodiment I), a width of each portion of the patterned mask 65 positioned above a respective first portion 131, 141, 151 is less than a width of the respective first portion 131, 141, 151. Therefore, referring to FIG. 13B, a width of top sections of the second portions 132, 142, 152 (e.g., the respective second sub-portions 1322, 1422, 1522 of FIG. 2) is less than the width of the respective first portions 131, 141, 151. Together, the first portions 131, 141, 151 and the second portions 132, 142, 152 form conductive pillars with an inverted T-shape.

Figure 14B:
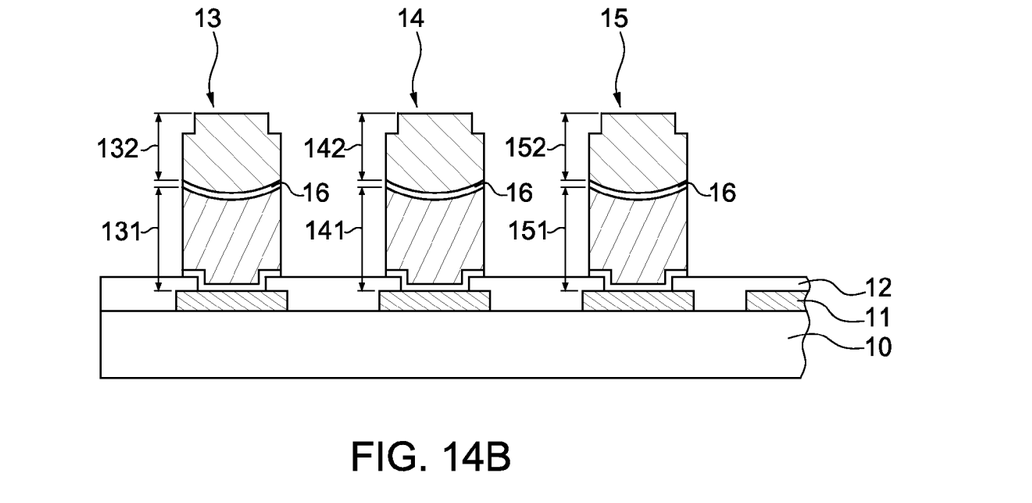

Referring to FIG. 14B, the dry film layer 62 and the patterned mask 65 are removed, such as by stripping, and the seed layer 61 is etched. The package substrate 2 of FIG. 2 is thereby formed.

Embodiment III

In accordance with an embodiment of the present disclosure, a package substrate is formed as illustrated in FIG. 11B, FIG. 12C, FIG. 13C and FIG. 14A.

Figure 11B:
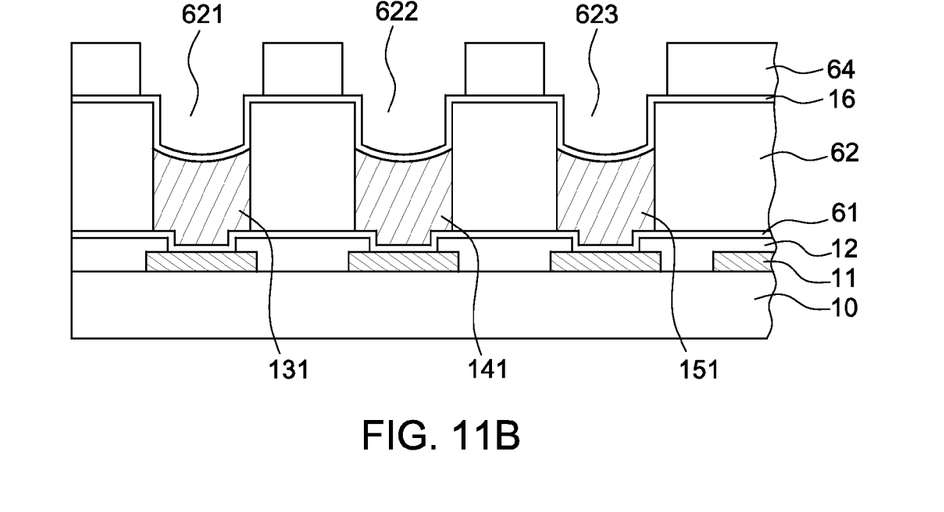

Referring to FIG. 11B, a dry film layer 64 is formed on the seed layer 16, and the openings 621, 622, 623 remain in spaces between portions of the dry film layer 64. A width of the spaces between the portions of the dry film layer 64 is greater than a width of the openings 621, 622, 623, as illustrated in FIG. 11B.

Figure 12C:
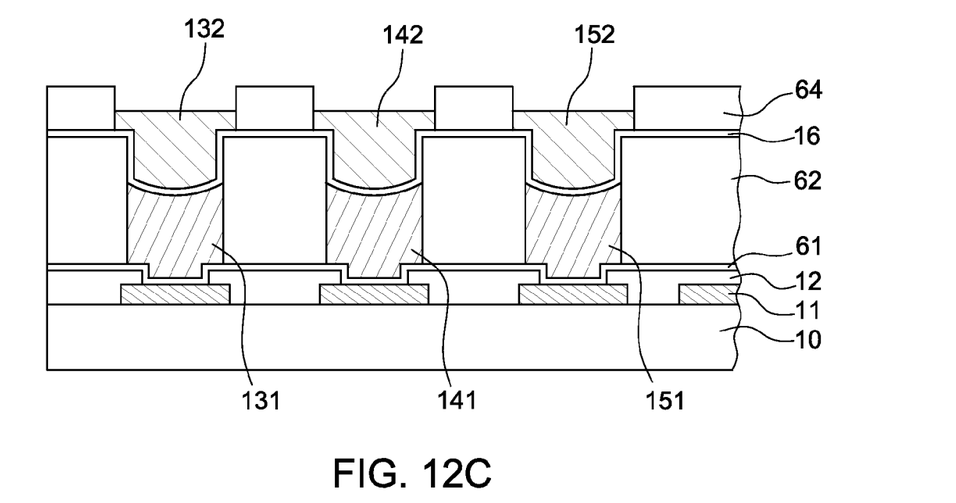

Referring to FIG. 12C, a second plating solution is used to perform a second plating to form the second portions 132, 142, 152 (e.g., of respective conductive pillars 13, 14, 15). In this embodiment, the first plating solution and the second plating solution can be the same (CPOS solution, for example), to provide for improved via-filling. Because the width of the spaces between the portions of the dry film layer 64 is greater than the width of the openings 621, 622, 623, a width of top sections of the second portions 132, 142, 152 (e.g., the respective second sub-portions 1322, 1422, 1522 of FIG. 1) is greater than the width of the first portions 131, 141, 151. Together, the first portions 131, 141, 151 and the second portions 132, 142, 152 form conductive pillars with a T-shape.

Figure 13C:
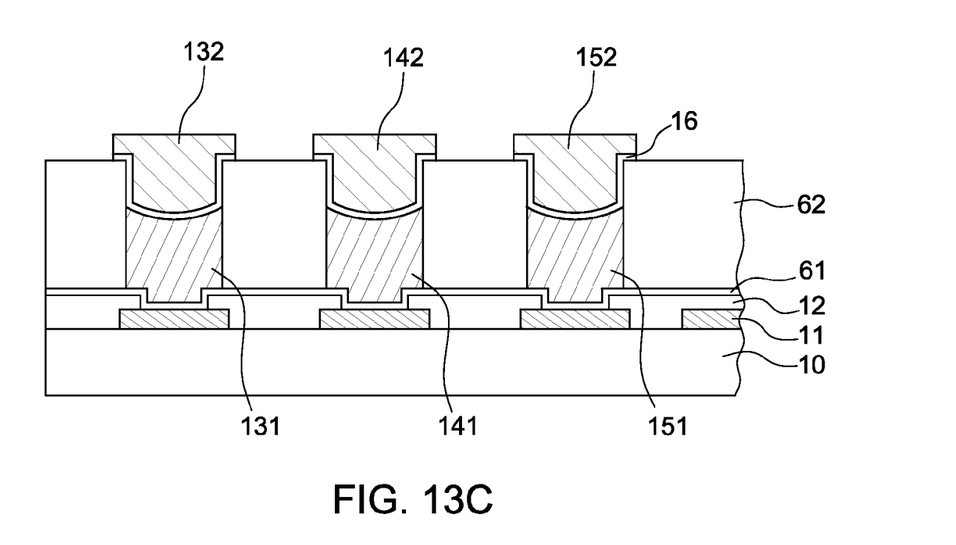
Figure 13D:
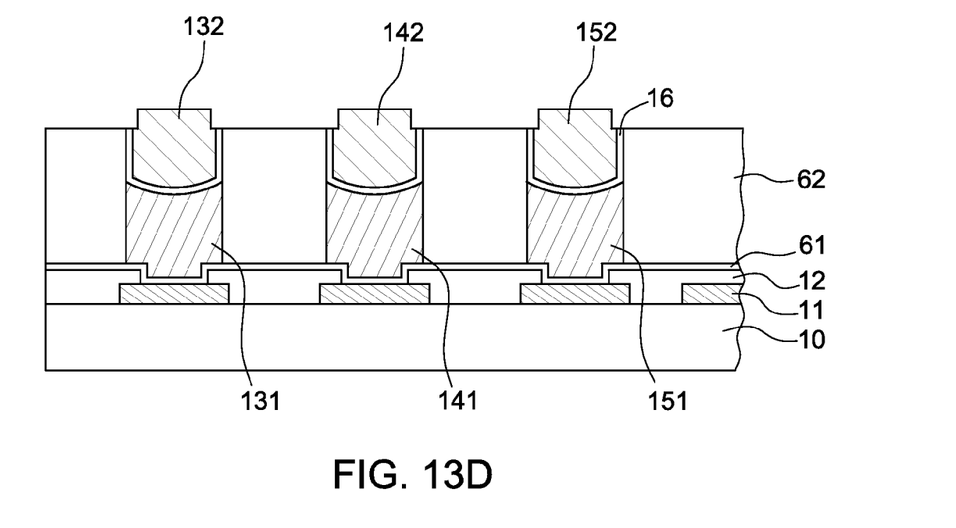

Referring to FIG. 13C, the dry film layer 64 is removed, such as by stripping.

Referring to FIG. 14A, the dry film layer 62 is removed, such as by stripping, and the seed layer 61 is etched. The package substrate 1 of FIG. 1 is thereby formed.

Embodiment IV

Figure 11C:
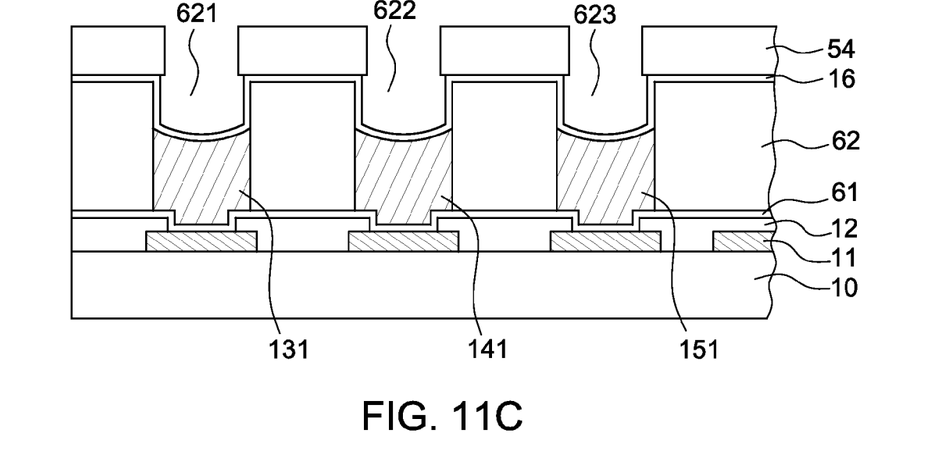
Figure 12D:
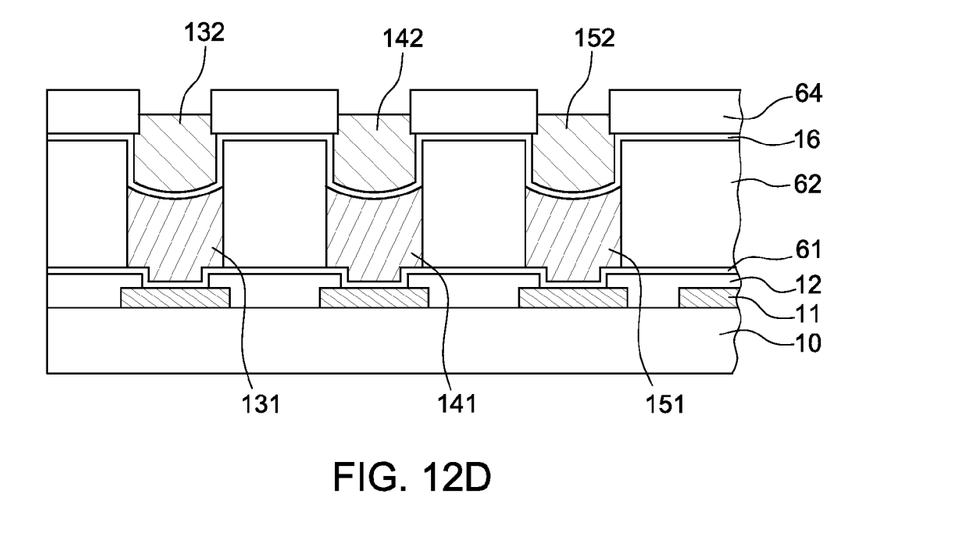

In accordance with an embodiment of the present disclosure, a package substrate is formed as illustrated in FIG. 11C, FIG. 12D and FIG. 14B.

Embodiment IV is similar to Embodiment III, except that, referring to FIGS. 11C and 12D (instead of FIGS. 11B and 12C of Embodiment III), a width of the spaces between the portions of the dry film layer 64 is less than a width of the openings 621, 622, 623. Therefore, referring to FIG. 12D, a width of top sections of the second portions 132, 142, 152 (e.g., the respective second sub-portions 1322, 1422, 1522 of FIG. 2) is less than the width of the respective first portion 131, 141, 151. Together, the first portions 131, 141, 151 and the second portions 132, 142, 152 form conductive pillars with an inverted T-shape.

Referring to FIG. 14B, the dry film layer 62 and the patterned mask 65 are removed, such as by stripping, and the seed layer 61 is etched. The package substrate 2 of FIG. 2 is thereby formed.

As illustrated in the embodiments above, a thickness of the dry film layer 62 is greater than a thickness of the first portions 131, 141, 151 of the respective conductive pillars 13, 14, 15 and less than a total thickness of the conductive pillars 13, 14 15. Thus, the first portions 131, 141, 151 are defined by the dry film layer 62, whereas the second portions 132, 142, 152 are partially defined by the dry film layer 62 and partially defined by the additional dry film layer 64. Uniformity of thickness of the conductive pillars 13, 14, 15 is determined by the sections of the second portions 132, 142, 152 that extend beyond the dry film layer 62, namely, the respective second sub-portions 1322, 1422, 1522 in FIG. 1 and FIG. 2. For example, if the second sub-portions 1322, 1422, 1522 are about 30 μm in thickness and the conductive pillars 13, 14, 15 are about 150 μm in thickness, a variation in the thicknesses of the second sub-portions 1322, 1422, 1522 of about 5 μm would not be significant in the context of a conductive pillar with about 150 μm in thickness.

The characteristics of the first and second plating solutions can be different, therefore, the plating solutions can be selected to achieve desired characteristics of the conductive pillars 13, 14, 15 (such as an improved via-filling characteristic or an improved uniformity characteristic).

Plating high aspect ratio structures can cause non-uniformity in a thickness of the high aspect ratio structures, and can further cause internal voids and other issues. Referring to FIG. 1 and FIG. 2, the double plating technique of the present disclosure provides for lower aspect ratio portions to be formed sequentially instead, thereby achieving an improvement in uniformity of thickness of the conductive pillars 13, 14, 15, and reducing the likelihood of internal voids or other issues related to high aspect ratio structures. As described above, a thickness of the second portions 132, 142, 152 is controlled to improve uniformity, and a thickness of the first portions 131, 141, 151 is greater than the thickness of the second portions 132, 142, 152 to increase a total thickness of the respective conductive pillars 13, 14, 15 while achieving the improved uniformity. In one or more embodiments of the present disclosure, the thickness of the first portions 131, 141, 151 is in the range of about 60% to about 75% of a total thickness of the respective conductive pillars 13, 14, 15.

Thus, as has been described, forming the conductive pillars 13, 14, 15 with double plating provides for improvement in the uniformity of the thickness of the conductive pillars 13, 14, 15. Because no grinding process is performed, the package substrate is not at risk for dimensional deviation due to grinding. Therefore, the present disclosure is particularly suitable for applications with thin package substrates.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations is not a limitation of the disclosure.

What is claimed is:

1. A package substrate, comprising:
   a patterned conductive layer; and
   a plurality of conductive pillars, wherein each of the conductive pillars includes:
   a first portion, having a first thickness, with one end contacting the patterned conductive layer, and
   a second portion, having a second thickness that is less than the first thickness, adjacent to another end of the first portion, the second portion including a first sub-portion and a second sub-portion, wherein the second portion includes corners between the first sub-portion and the second sub-portion;

wherein side surfaces of the first portion are substantially coplanar to side surfaces of the second portion, and wherein a combined thickness of the first portion and the second portion is about 50 µm to about 150 µm.

2. The package substrate of claim 1, wherein the first thickness of the first portion is about 60 percent to about 75 percent of a thickness of the respective conductive pillar.

3. The package substrate of claim 1, further comprising a seed layer disposed between the first portion and the second portion.

4. The package substrate of claim 1, wherein the first portion includes a concave surface, and the second portion includes a convex surface adjacent to the concave surface of the first portion.

5. The package substrate of claim 1, wherein the first portion includes a convex surface, and the second portion includes a concave surface adjacent to the convex surface of the first portion.

6. The package substrate of claim 1, wherein a thickness of the second sub-portion is about 20 µm to about 40 µm.

7. A semiconductor packaging structure, comprising:
a first substrate including a plurality of first pads and a plurality of second pads;
a first semiconductor device positioned on the first substrate and electrically connected to the first pads; and
a second substrate, including:
a first patterned conductive layer; and
a plurality of conductive pillars, wherein each of the conductive pillars includes:
a first portion, having a first thickness, with one end contacting the patterned conductive layer, and
a second portion, having a second thickness less than the first thickness, a first end of the second portion adjacent to another end of the first portion, the second portion including a first sub-portion and a second sub-portion, wherein the second portion includes corners between the first sub-portion and the second sub-portion,
wherein side surfaces of the first portion are substantially coplanar to side surfaces of the second portion, and
wherein the conductive pillars surround the semiconductor device and a second end of the second portion of each of the conductive pillars is connected to one of the second pads,
wherein a combined thickness of the first portion and the second portion of each of the conductive pillars is about 50 µm to about 150 µm.

8. The semiconductor packaging structure of claim 7, wherein the first thickness of the first portion is about 60 to about 75 percent of a thickness of a respective conductive pillar.

9. The semiconductor packaging structure of claim 7, further comprising a seed layer disposed between the first portion and the second portion.

10. The semiconductor packaging structure of claim 7, wherein the first portion includes a concave surface, and the second portion includes a convex surface adjacent to the concave surface of the first portion.

11. The semiconductor packaging structure of claim 7, wherein the first portion includes a convex surface, and the second portion includes a concave surface adjacent to the convex surface of the first portion.

12. The semiconductor packaging structure of claim 7, wherein a thickness of the second sub-portion is about 20 µm to about 40 µm.

13. The semiconductor packaging structure of claim 7, wherein the second substrate further includes a second patterned conductive layer, the second patterned conductive layer being disposed on a side of the second substrate that is opposite to a side on which the first patterned conductive layer is disposed.

14. The semiconductor packaging structure of claim 13, further comprising a second semiconductor device positioned on the second substrate and electrically connected to the second patterned conductive layer.

15. A semiconductor packaging structure, comprising:
a first substrate;
a second substrate; and
a conductive pillar extending between the first substrate and the second substrate, wherein the conductive pillar includes:
a first portion, having a first thickness, adjacent to the first substrate,
a second portion, having a second thickness that is less than the first thickness, adjacent to the second substrate, the second portion including a first sub-portion and a second sub-portion, wherein the second portion includes corners between the first sub-portion and the second sub-portion; and
a seed layer disposed between the first portion and the second portion,
wherein a side surface of the first portion is substantially coplanar to a side surface of the second portion,
wherein a combined thickness of the first portion and the second portion is about 50 µm to about 150 µm.

16. The semiconductor packaging structure of claim 15, wherein:
(a) the first portion includes a concave surface adjacent to the seed layer, and the second portion includes a convex surface adjacent to the seed layer, or
(b) the first portion includes a convex surface adjacent to the seed layer, and the second portion includes a concave surface adjacent to the seed layer.

17. The semiconductor packaging structure of claim 15, further comprising a semiconductor device positioned on the first substrate and electrically connected to the first substrate.

18. The semiconductor packaging structure of claim 15, wherein at least one of the first portion or the second portion includes copper.

19. The semiconductor packaging structure of claim 15, wherein the second substrate includes a first patterned conductive layer, the conductive pillar contacting the first patterned conductive layer, the second substrate further includes a second patterned conductive layer disposed on a side of the second substrate that is opposite to a side on which the first patterned conductive layer is disposed.

20. The semiconductor packaging structure of claim 19, further comprising a semiconductor device positioned on the second substrate and electrically connected to the second patterned conductive layer.

* * * * *